US010186222B2

(12) United States Patent
Zhang

(10) Patent No.: US 10,186,222 B2
(45) Date of Patent: Jan. 22, 2019

(54) LEVEL SHIFT CIRCUIT AND DISPLAY PANEL HAVING THE SAME

(71) Applicant: Shenzhen China Star Optoelectronics Technology Co., Ltd., Shenzhen (CN)

(72) Inventor: Xianming Zhang, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 156 days.

(21) Appl. No.: 15/128,217

(22) PCT Filed: Jul. 5, 2016

(86) PCT No.: PCT/CN2016/088615
§ 371 (c)(1),
(2) Date: Sep. 22, 2016

(87) PCT Pub. No.: WO2017/201820
PCT Pub. Date: Nov. 30, 2017

(65) Prior Publication Data

US 2018/0218697 A1 Aug. 2, 2018

(30) Foreign Application Priority Data

May 25, 2016 (CN) .......................... 2016 1 0356193

(51) Int. Cl.
*G09G 3/00* (2006.01)
*G11C 19/00* (2006.01)
*G09G 3/36* (2006.01)

(52) U.S. Cl.
CPC ............. *G09G 3/3677* (2013.01); *G09G 3/36* (2013.01); *G09G 2310/0289* (2013.01); *G09G 2310/06* (2013.01); *G09G 2310/08* (2013.01)

(58) Field of Classification Search
CPC .. G09G 3/3266; G09G 3/3674; G09G 3/3685; G09G 2300/0857;
(Continued)

(56) References Cited

U.S. PATENT DOCUMENTS 5,726,677 A * 3/1998 Imamura .............. G09G 3/3622 345/537
5,900,856 A * 5/1999 Iino ...................... G09G 3/3611 345/100

(Continued)

FOREIGN PATENT DOCUMENTS

CN 103106869 A 5/2013
CN 104009751 A 8/2014

(Continued)

OTHER PUBLICATIONS

International Search Report for PCT/CN2016/088615, Completed by the Chinese Patent Office on Dec. 12, 2016, 11 Pages.

*Primary Examiner* — Michael J Eurice
(74) *Attorney, Agent, or Firm* — Mintz Levin Cohn Ferris Glovsky and Popeo, P.C.; Kongsik Kim; Jhongwoo Jay Peck

(57) ABSTRACT

A level shift circuit in a gate driver on array circuit and a display panel. The level shift circuit includes a timing controller and a level shift chip. The timing controller includes a starting signal pin. The level shift chip includes a storing module and an operational amplifying module. The storing module stores initialization values. The timing controller is connected to the level shift chip via the starting signal pin. The timing controller is configured to send a starting signal to the operational amplifying module via the starting signal pin. The operational amplifying module is configured to be triggered to generate a plurality of timing signals based on the starting signal according to the initial-
(Continued)

ization values in the storing module, and send the plurality of timing signals to a display circuit of the display panel.

6 Claims, 2 Drawing Sheets

(58) Field of Classification Search
CPC ... G09G 2300/0861; G09G 2310/0286; G09G 2310/0289; G09G 2310/0291; G09G 2310/08; G11C 8/04; G11C 19/00; H04N 5/907
See application file for complete search history.

(56) References Cited

U.S. PATENT DOCUMENTS

| | | | | |
|---|---|---|---|---|
| 2003/0076149 | A1 * | 4/2003 | Haga | G09G 3/3688 327/333 |
| 2004/0160432 | A1 * | 8/2004 | Kubota | G09G 3/20 345/204 |
| 2006/0132417 | A1 * | 6/2006 | Shigenobu | G09G 3/3696 345/98 |
| 2008/0170024 | A1 * | 7/2008 | Song | G09G 3/3614 345/96 |
| 2009/0225068 | A1 * | 9/2009 | Jeong | G09G 3/3266 345/211 |
| 2010/0149082 | A1 * | 6/2010 | Hong | G09G 3/3611 345/88 |
| 2010/0149083 | A1 * | 6/2010 | Park | G09G 3/3611 345/99 |
| 2010/0156879 | A1 * | 6/2010 | Hong | G09G 3/3648 345/213 |
| 2010/0156885 | A1 * | 6/2010 | Cho | G09G 3/006 345/214 |
| 2010/0306633 | A1 | 12/2010 | Shintomi | |
| 2011/0169793 | A1 | 7/2011 | Chen et al. | |
| 2014/0118324 | A1 * | 5/2014 | Chan | G09G 3/3677 345/212 |
| 2015/0188431 | A1 * | 7/2015 | Cho | G09G 3/2003 345/212 |
| 2016/0247458 | A1 * | 8/2016 | Muto | G09G 3/344 |
| 2016/0335968 | A1 | 11/2016 | Zeng et al. | |
| 2018/0096644 | A1 * | 4/2018 | Jang | G09G 3/2092 |

FOREIGN PATENT DOCUMENTS

| | | |
|---|---|---|
| CN | 104660935 A | 5/2015 |
| CN | 104680991 | 6/2015 |
| CN | 105390106 | 3/2016 |

* cited by examiner

LEVEL SHIFT CIRCUIT AND DISPLAY PANEL HAVING THE SAME

CROSS-REFERENCE TO RELATED APPLICATION

This application is the U.S. national phase of PCT Application No. PCT/CN2016/088615 filed on Jul. 5, 2016, which claims priority to CN Patent Application No. 201610356193.3 filed on May 25, 2016, the disclosures of which are incorporated in their entirety by reference herein.

BACKGROUND OF THE INVENTION

1. Field of the Invention

The present disclosure relates to a display field, more particularly, to a level shift circuit and a display panel having the level shift circuit.

2. Description of Related Art

Gate driver on array (GOA) circuits are widely applied in LCD panels. The GOA circuit can save gate drivers of LCD. A gate circuits required by the GOA circuit is formed in a display panel, and a timing voltage required by the GOA circuit is generated by a level shifter. A timing controller (TCON) sends a plurality of signals, such as a starting signal (STV), a clock signal (CLK), and so on, to the level shifter. Each signal needs a pin of the timing controller to be output, which requires the timing controller to have a plurality of pins. Different timing controllers have different numbers of pins. Some timing controllers cannot be matched when the level shifter needs a plurality of signals to be output.

SUMMARY OF THE INVENTION

In order to overcome defects of prior art, the present disclosure provides a simplified level shift circuit and a display panel having the level shift circuit.

The invention provides a level shift circuit in a gate driver on array circuit. The level shift circuit includes a timing controller and a level shift chip. The timing controller includes a starting signal pin. The level shift chip includes a storing module and an operational amplifying module. The storing module stores initialization values. The timing controller is connected to the level shift chip via the starting signal pin. The timing controller is configured to send a starting signal to the operational amplifying module via the starting signal pin. The operational amplifying module is configured to be triggered to generate a plurality of timing signals based on the starting signal according to the initialization values in the storing module, and send the plurality of timing signals to a display circuit of the display panel.

Furthermore, the operational amplifying module is configured to be triggered to generate the plurality of timing signal based on a rising edge of the starting signal according to the initialization values in the storing module.

Furthermore, the initialization values comprises interval time between generating time of each timing signal and a rising edge of the starting signal.

Furthermore, the initialization values further comprises duration time of a high level and cycle time of the plurality of timing signals.

Furthermore, the level shift chip comprises a plurality of output pins, and the operational amplifying module is configured to output each timing signal to the display circuit via one of the plurality of output pins.

The invention further provides a display panel. The display panel includes a level shift circuit and a display circuit. The level shift circuit includes a timing controller and a level shift chip. The timing controller includes a starting signal pin. The level shift chip includes a storing module and an operational amplifying module. The storing module stores initialization values. The timing controller is connected to the level shift chip via the starting signal pin. The timing controller is configured to send a starting signal to the operational amplifying module via the starting signal pin. The operational amplifying module is configured to be triggered to generate a plurality of timing signals based on the starting signal according to the initialization values in the storing module, and send the plurality of timing signals to the display circuit of the display panel.

Furthermore, the operational amplifying module is configured to be triggered to generate the plurality of timing signal based on a rising edge of the starting signal according to the initialization values in the storing module.

Furthermore, the initialization values comprises interval time between generating time of each timing signal and a rising edge of the starting signal.

Furthermore, the initialization values further comprises duration time of a high level and cycle time of the plurality of timing signals.

Furthermore, the level shift chip comprises a plurality of output pins, and the operational amplifying module is configured to output each timing signal to the display circuit via one of the plurality of output pins.

The advantageous effects of the invention are as follows. The level shift circuit includes the timing controller and the level shift chip. The timing controller sends the starting signal to the level shift chip via the starting signal pin. The level shift chip is triggered to generate the plurality of timing signals based on the starting signal according to the initialization values, and to send the plurality of timing signals to the display circuit of the display panel, thereby reducing the number of pins between the timing controller and the level shift chip and simplifies the structure of the level shift circuit.

DETAILED DESCRIPTION OF THE PREFERRED EMBODIMENT

Hereinafter, various embodiments of the present disclosure are described in details in conjunction with the accompany drawings.

Figure 1:
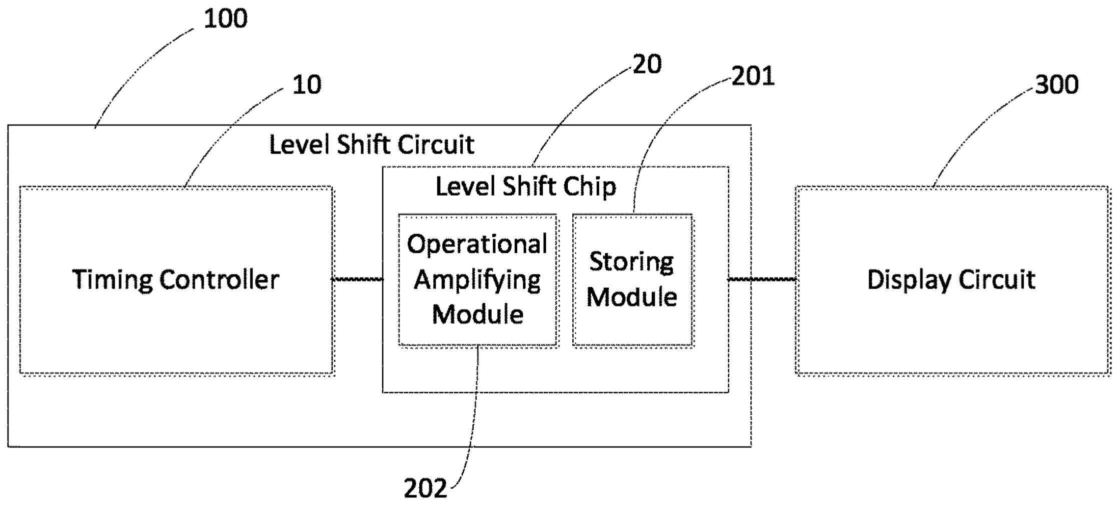
FIG. 1 is a block diagram of a display panel in accordance with an embodiment of the present disclosure.
Figure 2:
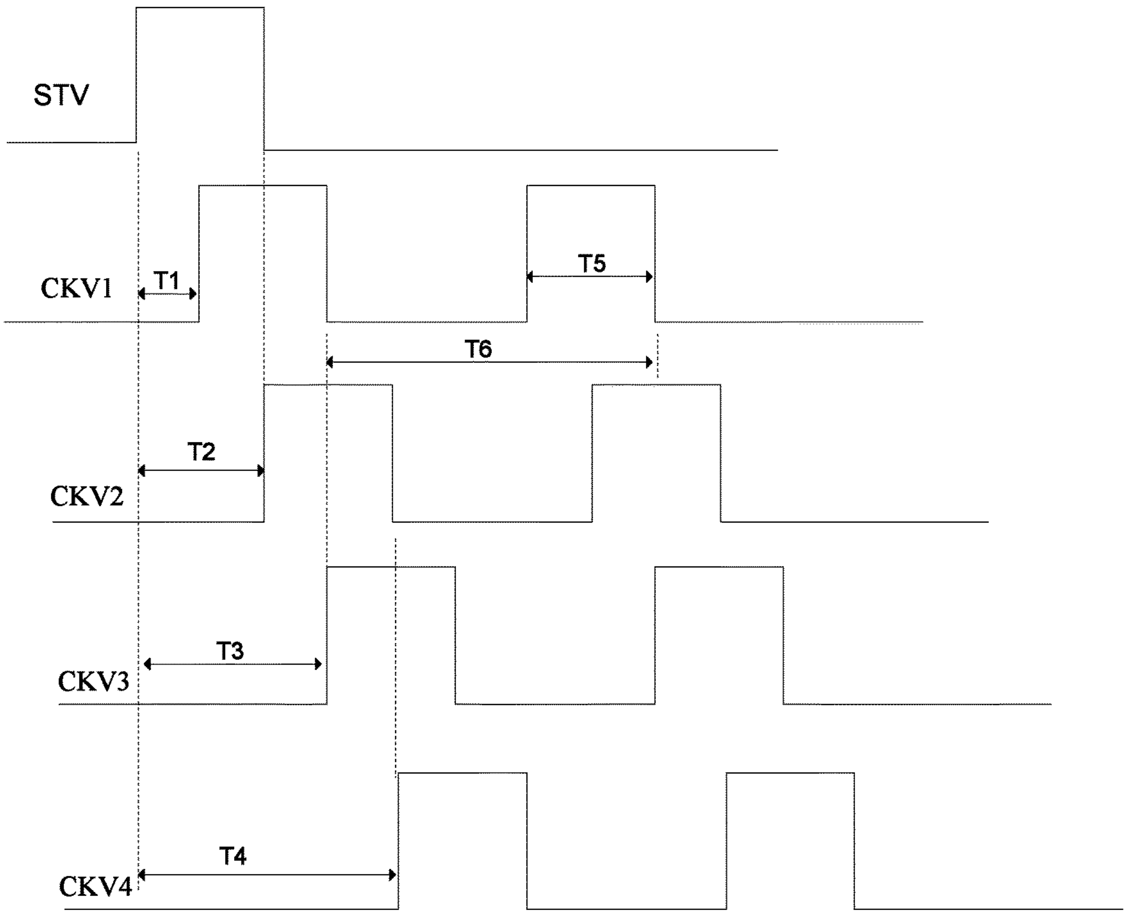
FIG. 2 is timing chart of a level shift circuit of a display panel in accordance with an embodiment of the present disclosure.

Referring to FIGS. 1 and 2, a display panel in accordance with an embodiment of the present disclosure includes a level shift circuit 100 and a display circuit 300. The level shift circuit 100 includes a timing controller 10 and a level shift chip 20. In the embodiment, the timing controller 10 and the level shift chip 20 are placed on an circuit driver board.

The level shift chip 20 includes a storing module 201 and an operational amplifying module 202.

The timing controller 10 is communicatively connected to the level shift chip 20 via a starting signal pin. The timing controller 10 is used for sending a starting signal (STV) to the operational amplifying module 202 via the starting signal pin. The storing module 201 stores initialization values. The initialization values include interval time T1~Tn between a rising edge of the starting signal and generating time of each timing signal, duration time $T_{n+1}$ of a high level of the timing signal, and cycle time $T_{n+2}$ of the timing signal. The operational amplifying module 202 is triggered to generate a plurality of timing signals based on the starting signal according to the initialization values stored in the storing module 201, and sending the plurality of timing signals to the display circuit 300 of the display panel.

Taking four timing signals CKV1~CKV4 output by the level shift chip 20 for example, the level shift chip 20 identifies the rising edge of the starting signal correctly, and is triggered to output four timing signals CKV1~CKV4 based on the rising edge of the starting time. The initialization values includes the interval time T1 between the generating time of the first timing signal CKV1 and the rising edge of the starting signal, the interval time T2 between the generating time of the second timing signal CKV2 and the rising edge of the starting signal, the interval time T3 between the generating time of the third timing signal CKV3 and the rising edge of the starting signal, and the interval time T4 between the generating time of the fourth timing signal CKV4 and the rising edge of the starting signal. In addition, the initialization values further includes the duration time T5 of the high level of the four timing signals CKV1~CKV4 and the cycle time T6. The duration time of the high level T5 and the cycle time T6 can be set to different values with respect to the display panels with different resolutions. The present embodiment just takes four timing signals for example, while the present disclosure is not limited to the above example, and more timing signals can also be applied in the present disclosure.

In addition, when the starting signal is in different statuses, such as in a common status, an angle-cutting status, a pre-charging status, and so on, the level shift chip 20 can trigger the corresponding timing signals according to the different statuses of the starting signal, thereby significantly improving compatibility of the level shift chip 20.

Compared with the existing level shift circuit of the liquid crystal display for a GOA structure, the level shift circuit of the present disclosure can reduce the number of pins between the timing controller 10 and the level shift chip 20, reduce a total number of wires between the timing controller 10 and the level shift chip 20, and reduce a size of the circuit driver board and production cost.

Although the present disclosure have been shown and described with reference to the particular embodiments, it will be understood by those skilled in the art that modifications can be made to these embodiments in form and details without departing from the spirit and the scope of the present disclosure, which is defined by the claims and their equivalents.

What is claimed is:

1. A level shift circuit in a gate driver on array circuit, comprising a timing controller and a level shift chip, wherein the timing controller comprises a starting signal pin; the level shift chip comprises a storing module and an operational amplifying module; the storing module stores initialization values; the timing controller is connected to the level shift chip via the starting signal pin; the timing controller sends a starting signal to the operational amplifying module via the starting signal pin; and the operational amplifying module is triggered to generate a plurality of timing signals based on a rising edge of the starting signal according to the initialization values in the storing module, and send the plurality of timing signals to a display circuit of a display panel; and wherein the initialization values comprise interval time between generating time of each timing signal and a rising edge of the starting signal.

2. The level shift circuit according to claim 1, wherein the initialization values further comprise duration time of a high level and cycle time of the plurality of timing signals.

3. The level shift circuit according to claim 1, wherein the level shift chip comprises a plurality of output pins, and the operational amplifying module is configured to output each timing signal to the display circuit via one of the plurality of output pins.

4. A display panel comprising a level shift circuit and a display circuit, wherein the level shift circuit comprises a timing controller and a level shift chip; the timing controller comprises a starting signal pin; the level shift chip comprises a storing module and an operational amplifying module; the storing module stores initialization values; the timing controller is connected to the level shift chip via the starting signal pin; the timing controller sends a starting signal to the operational amplifying module via the starting signal pin; and the operational amplifying module is triggered to generate a plurality of timing signals based on a rising edge of the starting signal according to the initialization values in the storing module, and send the plurality of timing signals to the display circuit of the display panel; and wherein the initialization values comprise interval time between generating time of each timing signal and a rising edge of the starting signal.

5. The display panel according to claim 4, wherein the initialization values further comprise duration time of a high level and cycle time of the plurality of timing signals.

6. The display panel according to claim 4, wherein the level shift chip comprises a plurality of output pins, and the operational amplifying module is configured to output each timing signal to the display circuit via one of the plurality of output pins.

* * * * *